US010450419B2

(12) United States Patent
Endo et al.

(10) Patent No.: US 10,450,419 B2
(45) Date of Patent: Oct. 22, 2019

(54) HIGH-MOLECULAR-WEIGHT POLYSILANE AND METHOD FOR PRODUCING SAME

(71) Applicant: Thin Film Electronics ASA, Oslo (NO)

(72) Inventors: Masahisa Endo, Toyama (JP); Gun Son, Toyama (JP); Yuichi Goto, Toyama (JP); Kentaro Nagai, Chiba (JP)

(73) Assignee: Thin Film Electronics ASA, Oslo (NO)

( * ) Notice: Subject to any disclaimer, the term of this patent is extended or adjusted under 35 U.S.C. 154(b) by 183 days.

(21) Appl. No.: 15/326,632

(22) PCT Filed: Jun. 30, 2015

(86) PCT No.: PCT/JP2015/068819
§ 371 (c)(1),
(2) Date: Jan. 16, 2017

(87) PCT Pub. No.: WO2016/009827
PCT Pub. Date: Jan. 21, 2016

(65) Prior Publication Data
US 2017/0210857 A1    Jul. 27, 2017

(30) Foreign Application Priority Data

Jul. 16, 2014  (JP) ................. 2014-145819

(51) Int. Cl.
| C08G 77/60 | (2006.01) |
| C01B 33/02 | (2006.01) |
| C01B 33/04 | (2006.01) |
| C03C 17/22 | (2006.01) |
| B05D 3/02 | (2006.01) |
| C01B 33/021 | (2006.01) |
| C09D 5/24 | (2006.01) |
| C09D 183/16 | (2006.01) |
| H01L 21/02 | (2006.01) |

(52) U.S. Cl.
CPC ........... *C08G 77/60* (2013.01); *B05D 3/0254* (2013.01); *C01B 33/02* (2013.01); *C01B 33/021* (2013.01); *C01B 33/04* (2013.01); *C03C 17/22* (2013.01); *C09D 5/24* (2013.01); *C09D 183/16* (2013.01); *H01L 21/02532* (2013.01)

(58) Field of Classification Search
CPC ..................................................... C08G 77/60
See application file for complete search history.

(56) References Cited

U.S. PATENT DOCUMENTS

| 4,554,180 A | 11/1985 | Hirooka |
| 4,900,861 A * | 2/1990 | Yokoyama ............. C08G 77/60 |
| | | 556/430 |
| 5,120,406 A | 6/1992 | Shono et al. |
| 5,336,798 A * | 8/1994 | Fukushima ........... C07F 7/0896 |
| | | 556/430 |
| 9,394,813 B2 | 7/2016 | Gemin et al. |
| 10,202,283 B2 | 2/2019 | Goto et al. |
| 2001/0021760 A1 | 9/2001 | Matsuki et al. |
| 2006/0159859 A1 | 7/2006 | Iwasawa |
| 2008/0085373 A1 | 4/2008 | Karshtedt et al. |
| 2009/0215920 A1 | 8/2009 | Iwasawa et al. |
| 2011/0158886 A1 | 6/2011 | Shimoda et al. |
| 2011/0189072 A1 | 8/2011 | Brausch et al. |
| 2012/0061679 A1 | 3/2012 | Karshtedt et al. |
| 2013/0026453 A1 * | 1/2013 | Kunze ..................... C01B 33/04 |
| | | 257/40 |

(Continued)

FOREIGN PATENT DOCUMENTS

| JP | 4331235 A | 1/1991 |
| JP | 1059707 A | 3/1998 |

(Continued)

OTHER PUBLICATIONS

International Preliminary Report on Patentability dated Jan. 17, 2017; International Application No. PCT/JP2015/068819; 16 pages; The International Bureau of WIPO, Geneva, Switzerland.
"Method for Manufacturing Higher Hydridosilanes"; Bibliographic Data of JP2011524329 (A); Sep. 1, 2011; https://worldwide.espacenet.com.
"Silicon Polymers, Methods of Polymerizing Silicon Compounds, and Methods of Forming Thin Films from Such Silicon Polymers"; Bibliographic Data of JP2010506001 (A); Feb. 25, 2010; https://worldwide.espacenet.com.

(Continued)

*Primary Examiner* — Margaret G Moore
(74) *Attorney, Agent, or Firm* — Andrew D. Fortney; Central California IP Group, P.C.

(57) ABSTRACT

There is provided a highly conductive and good silicon thin film which is obtained by applying a coating-type polysilane composition prepared by use of a polysilane having a large weight average molecular weight to a substrate, followed by baking. A polysilane having a weight average molecular weight of 5,000 to 8,000. The polysilane may be a polymer of cyclopentasilane. A silicon film obtained by applying a polysilane composition in which the polysilane is dissolved in a solvent to a substrate, and baking the substrate at 100° C. to 425° C. The cyclopentasilane may be polymerized in the presence of a palladium catalyst supported on a polymer. The palladium catalyst supported on a polymer may be a catalyst in which palladium as a catalyst component is immobilized on a functional polystyrene. The palladium may be a palladium compound or a palladium complex. The palladium-immobilized catalyst may be formed by micro-encapsulating a zero-valent palladium complex or a divalent palladium compound with a functional polystyrene. The zero-valent palladium complex may be a tetrakis(triphenylphosphine)palladium (0) complex.

20 Claims, No Drawings

(56) References Cited

U.S. PATENT DOCUMENTS

2013/0252407 A1    9/2013    Karshtedt et al.

FOREIGN PATENT DOCUMENTS

| JP | 2001262058 | A  | 9/2001  |
|----|------------|----|---------|
| JP | 2005022964 | A  | 1/2005  |
| JP | 2006188620 | A  | 7/2006  |
| JP | 2010506001 | A  | 2/2010  |
| JP | 2011524329 | A  | 9/2011  |
| JP | 602664     | B2 | 11/2016 |
| WO | 2010005107 | A1 | 1/2010  |
| WO | 2016010038 | A1 | 6/2017  |

OTHER PUBLICATIONS

Tatsuya Shimoda et al.; "Polysilane Manufacturing Method"; Bibliographic Data of WO2010005107 (A1); Jan. 14, 2010; 2 pages; https://worldwide.espacenet.com.

Hiroaki Murase et al.; "Method for Producing Polysilanes"; Bibliographic Data of JP2006188620 (A); Jul. 20, 2006; 2 pages; https://worldwide.espacenet.com.

Haruo Iwazawa et al.; "Silane Polymer and Method for Forming Silicon Film"; Bibliographic Data of JP2005022964 (A); Jan. 27, 2005; https://worldwide.espacenet.com.

Yasuo Matsuki et al.; "Composition and Process for Forming Silicon Film"; Bibliographic Data of JP2001262058 (A); Sep. 26, 2001; https://worldwide.espacenet.com.

Tatsuya Shono et al.; "Production of Polysilane"; Bibliographic Data of JP04-331235 (A); Nov. 19, 1992; https://www4.j-platpat.inpit.go.jp.

International Search Report; dated Sep. 29, 2015; International Application No. PCT/JP2015/068819; 2 pages; International Searching Authority/Japan Patent Office; Tokyo, Japan.

Office Action dated Jul. 23, 2018, in Chinese Patent Application No. 201580038296.9; 6 pages; The State Intellectual Property Office of the P.R.C., People's Republic of China.

Office Action with English translation dated Aug. 7, 2019; Japanese Patent Application No. 2016-534356; 3 pgs.; Japanese Patent Office, Tokyo, Japan.

Kanji Sakata et al; "Production of Monosilane"; Bibliographic Data of JPH1059707 (A);Mar. 3, 1998; http://worldwide.espacenet.com.

Dong Won Lee et al: "Dephenylation of Decaphenylcylcopentasilane with HCI Catalyzed by Aluminum Chloride: Facile Synthetic Route to Cylcopentasilane"; Organosilicon Chemistry Laboratory Korea Institute of Science and Technology; vol. 30. No. 10.

Dana Schmidt: "Cylcopentasilane $Si_xH_{10}$ First Single Crystal X-ray Structure of an Olioglosilane $Si_xH_y$ and Thermal Analysis with TG/MS"; Inorganic Chemistry Communications; pp. 92-95.

"Method for Producing Cyclic Silane Using Concentration Method"; Bibliographic Data of WO2016010038 (A1); Jun. 8, 2016; http://worldwide.espacenet.com.

"Exhaust-Gas Heat Exchanger"; Bibliographic Data of JP602664(B2); Nov. 16, 2016; http://worldwide.espacenet.com.

\* cited by examiner

HIGH-MOLECULAR-WEIGHT POLYSILANE AND METHOD FOR PRODUCING SAME

RELATED APPLICATION(S)

The present application is a national phase application of International Application No. PCT/JP2015/068819, filed Jun. 30, 2015, which claims priority to Japanese Pat. Appl. No. 2014-145819, filed Jul. 16, 2014.

TECHNICAL FIELD

The present invention relates to a high-molecular-weight polysilane and a method for producing the same. Further, the present invention relates to a silane polymer used for applications such as integrated circuits and thin-film transistors.

BACKGROUND ART

A silicon semiconductor is a material that has been conventionally investigated for materials for thin-film transistor (TFT) and solar cell.

In formation of a pattern of a silicon thin film used for applications such as integrated circuits and thin-film transistors, a silicon film is generally formed through a vacuum process such as a CVD process and others. Since in a device for this formation, the vacuum process is used, the device is required to be large-scale. Further, there are problems in which handling is difficult since a raw material is a gas.

In order to solve the problems, there is a procedure in which the silane polymer is dissolved in an organic solvent, applied to a substrate, baked, and dehydrogenated to form a silicon film.

For example, a composition containing an oligosilane or polysilane consisting of hydrogen and silicon and/or germanium and having a molecular weight of 450 to 2,300, which, after coating and printing the composition to form an oligo- or polysilane film, and then curing, forms an amorphous, hydrogenated semiconductor film having a carbon content of 0.1% by atom or less is disclosed (Patent Document 1). Synthesis of polysilane using a heterogeneous catalyst consisting of transition metal elements of Groups 7 to 12 or substrate-anchored derivatives thereof is described.

A method for producing a silane polymer including irradiating a photopolymerizable silane compound with a light having a wavelength of 405 nm to produce a silane polymer having a weight average molecular weight that is measured by gel permeation chromatography in terms of polystyrene of 800 to 5,000 is disclosed (Patent Document 2).

A composition containing a cross-linked polymer containing: (a) linear chains of atoms that are cross-linked to each other via a direct bond between atoms from different chains, wherein the atoms are independently selected from the group consisting of a Si atom and a Ge atom; and (b) side chains R as R groups that are directly bonded to the atoms in the chain to complete the valence of the atoms in the chain, provided that when all the R groups are independently selected from the group consisting of hydrogen, halogen, an aromatic hydrocarbyl group, and a substituted aromatic hydrocarbyl group, the degree of cross-linking includes about 10% or less of the linear chain of atoms is disclosed (Patent Document 3).

A method for forming an amorphous silicon-deposited film on a support placed in a deposition chamber by introducing a cyclic silane compound of general formula $(SiH_2)_n$ (n=4, 5, or 6) in a gas state with a carrier gas into the deposition chamber, and applying heat energy under normal pressure is disclosed (Patent Document 4).

However, the average molecular weights of the polysilane and the silicon-containing polymer are small. Therefore, there are problems in which the crystallinity of dehydrogenated polysilane to be obtained by baking is low and high conductivity is not achieved.

PRIOR ART DOCUMENTS

Patent Documents

Patent Document 1: Japanese Patent Application Publication No. 2010-506001 (JP 2010-506001 A)
Patent Document 2: Japanese Patent Application Publication No. 2005-22964 (JP 2005-22964 A)
Patent Document 3: Japanese Patent Application Publication No. 2009-511670 (JP 2009-511670 A)
Patent Document 4: Japanese Patent Application Publication No. S60-26664 (JP S60-26664 A)

SUMMARY OF THE INVENTION

Problem to be Solved by the Invention

An object of the present invention is to obtain a polysilane having a large weight average molecular weight, and to obtain a highly conductive and good silicon thin film by forming a coating-type polysilane composition using the polysilane, and applying the composition to a substrate, followed by baking.

Means for Solving the Problems

A first aspect of the present invention is a polysilane having a weight average molecular weight of 5,000 to 8,000.

A second aspect is the polysilane according to the first aspect, wherein the polysilane is a polymer of cyclopentasilane.

A third aspect is a silicon film obtained by applying a polysilane composition in which the polysilane according to the first or second aspect is dissolved in a solvent to a substrate, and baking the substrate at 100° C. to 425° C.

A fourth aspect is a method for producing the polysilane according to the second aspect comprising a step of polymerizing cyclopentasilane in the presence of a palladium catalyst supported on a polymer.

A fifth aspect is the method according to the fourth aspect, wherein the palladium catalyst supported on a polymer is a catalyst in which palladium as a catalyst component is immobilized on a functional polystyrene.

A sixth aspect is the method according to the fifth aspect, wherein the palladium is a palladium compound or a palladium complex.

A seventh aspect is the method according to the fifth aspect, wherein the palladium-immobilized catalyst is formed by microencapsulating a zero-valent palladium complex or a divalent palladium compound with the functional polystyrene.

An eighth aspect is the method according to the seventh aspect, wherein the zero-valent palladium complex is a tetrakis(triphenylphosphine)palladium (0) complex.

A ninth aspect is the method according to the fifth aspect, wherein the palladium-immobilized catalyst is formed by bonding a palladium compound to the functional polystyrene.

A tenth aspect is the method according to the fifth, seventh, or ninth aspect, wherein the functional polystyrene is a polystyrene having a polyethylene oxide group having a hydroxy group at the terminal or a polystyrene having a diphenylphosphino group.

An eleventh aspect is the method according to any one of the fourth to tenth aspects, wherein the cyclopentasilane is contained in a cyclic silane of Formula (3) obtained through the following (A) and (B) steps:

the (A) step of reacting a cyclic silane of Formula (1):

(SiR$^1$R$^2$)$n$  Formula (1)

(wherein R$^1$ and R$^2$ are each a hydrogen atom, a C$_{1-6}$ alkyl group, or an optionally substituted phenyl group (provided that both R$^1$ and R$^2$ are not simultaneously hydrogen atoms), and n is an integer of 4 to 6) with hydrogen halide in an organic solvent in the presence of aluminum halide to obtain a cyclic silane of Formula (2):

(SiR$^3$R$^4$)$n$  Formula (2)

(wherein R$^3$ and R$^4$ are each a halogen atom, and n is an integer of 4 to 6), and the (B) step of reducing the cyclic silane of Formula (2) with hydrogen or lithium aluminum hydride to obtain the cyclic silane of Formula (3):

(SiH$_2$)$n$  Formula (3)

(wherein n is an integer of 4 to 6).

A twelfth aspect is the method according to the eleventh aspect, wherein both R$^1$ and R$^2$ are phenyl groups.

A thirteenth aspect is the method according to the eleventh aspect, wherein both R$^3$ and R$^4$ are chlorine atoms.

A fourteenth aspect is the method according to the eleventh aspect, wherein the cyclopentasilane in an amount of 80% by mole or more is contained in the cyclic silane of Formula (3).

Effects of the Invention

The present invention relates to a polysilane having a weight average molecular weight of 5,000 to 8,000. The polysilane is mainly obtained by polymerization of cyclopentasilane.

In order to produce such a polysilane having a high molecular weight, cyclopentasilane as a main raw material is polymerized in the presence of a palladium catalyst supported on a polymer.

When the polymer-supported palladium catalyst is used, the catalyst can be separated from a product by a simple operation such as filtration. This is because the catalyst is a solid phase. Therefore, the amount of a catalyst residue (palladium and polymer component) remaining in the liquid polysilane to be obtained is small. In addition, since the polymer-supported palladium catalyst is capable of recycling, it is useful in terms of production cost.

The high-molecular-weight polysilane thus produced is dissolved in a solvent to obtain a coating-type polysilane composition. The coating-type polysilane composition is applied to a substrate, and baked to obtain silicon having high crystallinity. The silicon film has high conductivity.

When the polysilane (polycyclopentasilan) obtained using the polymer-supported palladium catalyst is baked at a lower temperature as compared with conventional polysilane, a silicon film is obtained. The obtained silicon film is amorphous and/or polycrystal silicon.

MODES FOR CARRYING OUT THE INVENTION

The weight average molecular weight of the polysilane of the present invention is 5,000 to 8,000, 5,500 to 8,000, or 5,500 to 7,000.

The weight average molecular weight can be measured by gel permeation chromatography (GPC). In the measurement, a measurement device is HLC-8320GPC (product name, manufactured by TOSOH CORPORATION), a column is GPC/SEC (PLgel, 3 μm, 300×7.5 mm, manufactured by Varian, Inc.), a column temperature is 35° C., a detector is RI, a flow rate is 1.0 mL/min, a measurement time is 15 minutes, an eluent is cyclohexane, and an injection volume is 10 μL. The weight average molecular weight of a product can be measured by forming a calibration curve using CPS (Mw 150, RT=11.040 minutes), CPS-dimer (Mw 298, RT=10.525 minutes), CPS-Trimer (Mw 446, RT=9.725 minutes) as standard substances.

The polysilane is obtained by polymerization of a cyclic silane containing cyclopentasilane as a main component in the presence of the polymer-supported palladium catalyst.

The polymerization ratio of the weight of produced polymer to the prepared weight is 50% or more, preferably 70% or more, and preferably 80% or more.

The polysilane is mainly a polymer of cyclopentasilane. In the production of the polysilane, cyclopentasilane is a main raw material. However, the polysilane may contain other silanes. Examples thereof include cyclotrisilane, cyclotetrasilane, cyclopentaslane, cyclohexasilane, and cycloheptasilane. Examples of a silane having two cyclic structures include 1,1'-bicyclobutasilane, 1,1'-bicyclopentasilane, 1,1'-bicyclohexasilane, 1,1'-bicycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2.2]pentasilane, spiro[3.3]heptasilane, spiro[4.4]nonasilane, spiro[4.5]decasilane, spiro[4.6]undecasilane, spiro[5.5]undecasilane, spiro[5.6]undecasilane, and spiro[6.6]tridecasilane. Examples thereof may include silane compounds in which a hydrogen atom in scaffolds of the silanes described above is substituted by a SiH$_3$ group or a halogen atom (e.g., chlorine atom and bromine atom).

The high-molecular-weight polysilane is obtained by the following reaction.

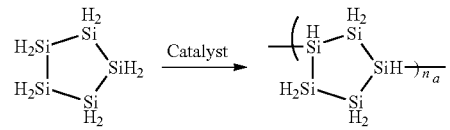

$n_a$ is the number of repeating unit, and the number corresponding to a weight average molecular weight. A linear chain structure is typical, but a three-dimensionally bonded structure is also considered.

Examples of the catalyst used in the polymerization reaction include palladium catalysts supported on a polymer. In particular, a catalyst in which palladium as a catalyst component is immobilized on a functional polystyrene is preferred. Examples of an immobilization method on the functional polystyrene include a method of microencapsulating a palladium complex with the functional polystyrene and a method of bonding a palladium compound to the functional polystyrene.

When the palladium complex is used, examples of palladium include zero-valent metal palladium and divalent palladium compounds. Examples of the zero-valent palladium complex include a tetrakis(triphenylphosphine)palladium (0) complex. Examples of the divalent palladium compound include palladium acetate and palladium chloride.

The functional polystyrene is a styrene derivative or a styrene copolymer, and examples thereof include structures in which a functional group is bonded to styrene units shown below. Examples of the functional group include a polyethylene oxide group having a hydroxy group at the terminal and a diphenylphosphino group.

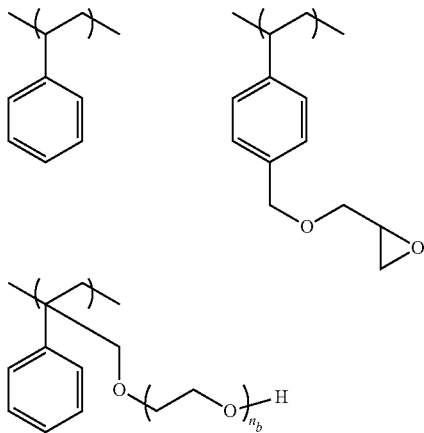

$n_b$ is the number of repeating unit, and is in a range of 1 to 10.

For example, the polymer-supported palladium catalyst can be obtained by holding the functional polystyrene and the tetrakis(triphenylphosphine)palladium (0) complex at 120° C. for 2 hours.

Examples of microencapsulation of the zero-valent palladium complex or the divalent palladium compound with a polystyrene may include as follows.

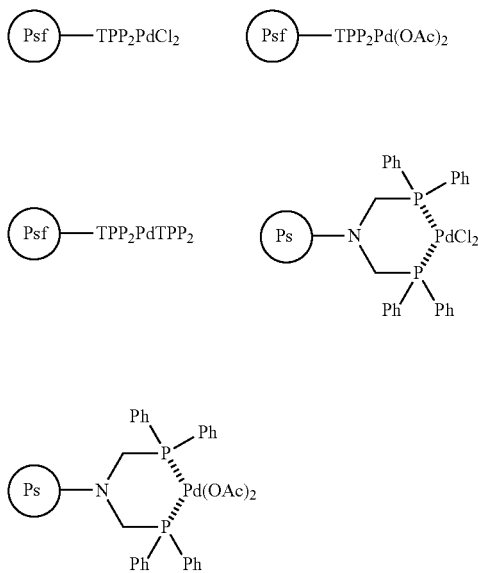

Ps is polystyrene, Psf is functional polystyrene, Ph is phenyl group, Tpp is triphenylphosphine ligand, and Ac is acetyl group.

Examples of bonding of the palladium compound to the functional polystyrene may include as follows.

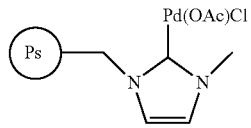

Ps is polystyrene, and Ac is acetyl group.

In the polymer-supported palladium catalyst, palladium may be contained in an amount of 0.1 to 10% by mass, or 2 to 4% by mass in the polymer.

When cyclopentasilane is polymerized in the presence of the polymer-supported palladium catalyst, the amount of catalyst to be added may be set so that palladium is contained in an amount of 0.1 to 10% by mass or 0.1 to 1% by mass relative to cyclopentasilane. The polymerization reaction is carried out under an inert gas atmosphere such as nitrogen, helium, and argon. Thus, oxygen is blocked. For example, the polymerization reaction is carried out at an oxygen concentration of 1 ppm or less. The polymerization reaction may be carried out by dissolving cyclopentasilane and the catalyst in a solvent, or the polymerization reaction may be carried out without a solvent. The polymerization reaction may be carried out at a reaction temperature of room temperature to 100° C. The reaction time may be 1 to 15 hours. The reaction may be terminated by adding cyclohexane or cyclooctane.

The polysilane product can be obtained by removing a volatile component of the reaction product to be obtained under reduced pressure, and can be stored by dissolving it in a solvent. Examples of a solvent for polysilane include hydrocarbon solvents such as n-hexane, n-heptane, n-octane, n-decane, cyclohexane, cyclooctane, dicyclopentane, benzene, toluene, xylene, durene, indene, tetrahydronapthalene, decahydronaphthanylene, and squalane; ether-based solvents such as dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, 1,2-dimethoxyethane, bis(2-methoxyethyl) ether, and p-dioxane; propylene carbonate, γ-butyrolactone, N-methyl-2-pyrrolidone, dimethylformamide, acetonitrile, and dimethylsulfoxide.

Among the solvents, cyclooctane is preferably used. A polysilane composition in which 5 to 8% by mass of the polysilane is contained in cyclooctane can be produced.

To the polysilane, a substance containing an element of Group 3B or 5B can be added as a dopant. Examples of the substance include compounds of phosphorous, boron, and the like. The polysilane composition in which such a dopant is added is applied to a substrate, and is subjected to a treatment including heating. Thus, an n-type or p-type silicon film can be formed.

A method for forming the silicon film will be described. The polysilane composition is applied to a substrate, and dehydrogenated by a heat treatment or the like, to obtain the silicon film. In the coating, a device for spin coating, roll coating, dip coating, or the like is used. After the coating, a heat treatment is carried out. For example, the revolution speed of spinner in a spin coating method is 500 to 1,000 rpm.

It is preferable that a coating step be carried out under an inert gas atmosphere, for example, under a stream of gas of nitrogen, helium, argon, or the like.

The coated substrate is subjected to a heat treatment. The heat treatment is carried out at a heating temperature of 100° C. to 425° C. for 10 to 20 minutes.

The obtained silicon film has a thickness falling within a range of 60 to 100 nm.

Examples of the substrate include a transparent electrode of quartz, glass, and ITO, an electrode of metal such as gold, silver, copper, nickel, titanium, aluminum, and tungsten, a glass substrate, and a plastic substrate.

The cyclopentasilane used in the present invention can be synthesized through the (A) and (B) steps.

Examples of the $C_{1-6}$ alkyl group in the cyclic silane of Formula (1) include methyl group, ethyl group, n-propyl group, isopropyl group, cyclopropyl group, n-butyl group, isobutyl group, sec-butyl group, tert-butyl group, cyclobutyl group, 1-methyl-cyclopropyl group, 2-methyl-cyclopropyl group, and n-pentyl group. Examples of substituent in the optionally substituted phenyl group include the alkyl groups described above. Only the cyclic silane in which n is an integer of 4 to 6, and preferably 5, or the cyclic silane in which n is 5 may be used as a main component. For example, the cyclic silane in which n is 5 and $R^1$ and $R^2$ are phenyl groups is decaphenylcyclopentasilane. Decaphenylcyclopentasilane may be preferably used as a raw material. Further, the cyclic silanes in which n is 4 and 6 may be contained.

At the (A) step, the cyclic silane of Formula (2) can be synthesized by reacting the cyclic silane of Formula (1) with halogen (including fluorine, chlorine, bromine, and iodine, and chlorine is preferred) or hydrogen halide.

In this case, the reaction may be carried out in an organic solvent (e.g., cyclohexane, hexane, heptane, toluene, and benzene) using aluminum halide (e.g., aluminum chloride and aluminum bromide) as a catalyst. The hydrogen halide (e.g., hydrogen chloride) is required in an amount of 2n mol or more relative to n mol of the cyclic silane, for example, in an amount of 2.5n mol to 3.5n mol. Alternatively, an excessive amount of the hydrogen halide may be added. The catalyst may be added in an amount of 0.01 mol to 2 mol relative to 1 mol of the cyclic silane. When hydrogen chloride is used at the (A) step, $R^3$ and $R^4$ in Formula (2) are chlorine atoms.

At the (B) step, the cyclic silane of Formula (2) is reduced with hydrogen or lithium aluminum hydride to obtain the cyclic silane of Formula (3). In Formula (3), n is an integer of 4 to 6. However, it is preferable that the amount of cyclopentasilane in all the silanes to be obtained be 80% by mole or more, for example, 80 to 100% by mole, and 90 to 100% by mole. It is particularly preferable that cyclopentasilane having high purity (100% by mole) be used.

At the (B) step, the compound of Formula (2) is dissolved in an organic solvent (e.g., cyclohexane, hexane, heptane, toluene, and benzene), and lithium aluminum halide dissolved in ether (e.g., diethyl ether, tetrahydrofuran, and cyclopentyl methyl ether) is gradually added to reduce the cyclic silane of Formula (2). Thus, the cyclic silane of Formula (2) can be converted into the cyclic silane of Formula (3). The lithium aluminum hydride at that time may be added in an amount of 2 to 3 mol relative to 1 mol of the cyclic silane of Formula (2).

As the cyclic silane of Formula (1) that is a raw material for synthesis of the cyclopentasilane, an article on the market may be used. In the synthesis, the cyclic silane of Formula (1) can be obtained by reacting a silane of Formula (a):

   Formula (a)

(wherein $R^1$ and $R^2$ are each a hydrogen atom, a $C_{1-6}$ alkyl group, or an optionally substituted phenyl group, and X is a halogen atom) in an organic solvent in the presence of alkali metal.

Examples of the $C_{1-6}$ alkyl group and the optionally substituted phenyl group include the examples described above. Examples of the halogen atom include fluorine, chlorine, bromine, and iodine. Chlorine may be preferably used. The alkali metal is an alkali metal such as lithium, sodium, and potassium. The alkali metal is dispersed in the organic solvent such as tetrahydrofuran, and the silane of Formula (a) is further added to produce the cyclic silane of Formula (1). The amount of the alkali metal used at that time is about 1.5 to 3 mol time that of the silane. This reaction is carried out at room temperature, and the obtained product is recrystallized.

Examples of the silane of Formula (a) include diphenyldichlorosilane, diphenyldibromosilane, diphenyldiiodesilane, di(phenyl chloride)dichlorosilane, dimethyldichlorosilane, and dimethyldibromosilane.

EXAMPLES

Example 1 (Synthesis of Polycyclopentasilane by Polymerization of Cyclopentasilane Using Palladium Catalyst Supported on Polymer)

Cyclopentasilane (0.8 g) was placed in a glass sample tube that contained 0.44% by mole of commercially available polymer-supported palladium catalyst (available from Wako Pure Chemical Industries, Ltd., trade name PIPd (Pd content: 3% by mass), 82.1 mg) under an inert atmosphere. The sample tube was loosely capped. In the sample tube, the reaction mixture was stirred for 1 hour. The reaction was then terminated with 5.14 g of cyclohexane. An insoluble component was sedimented, and the mixture was then filtered through a membrane filter made of polytetrafluoroethylene with a pore diameter of 0.45 μm. Subsequently, the solution was placed in a recovery flask, and a pressure was reduced (about 20 Torr or less, for example, 1 to 20 Torr) to remove a volatile component. The product can be stored as an 8% by mass solution in which the product is dissolved in distilled cyclooctane. The product was measured by gel permeation chromatography. Mn was 4,488 and Mw was 6,454. The amount of residue cyclopentasilane that remained without polymerization was 15.2% by mass.

Comparative Example 1 (Synthesis of Polycyclopentasilane by Polymerization of Cyclopentasilane Using Hydrotalcite-Supported Palladium Catalyst)

Cyclopentasilane (0.75 g) was placed in a glass sample tube that contained 0.88% by mole of commercially available hydrotalcite-supported palladium catalyst (available from Wako Pure Chemical Industries, Ltd., Pd content: 1.5% by mass, 311.0 mg) under an inert atmosphere. The sample tube was loosely capped. In the sample tube, the reaction mixture was stirred for about 20 hours. The reaction was then terminated with 7.68 g of cyclohexane. An insoluble component was sedimented, and the mixture was then filtered through a membrane filter made of polytetrafluoroethylene with a pore diameter of 0.45 μm. Subsequently, the solution was placed in a recovery flask, and a pressure was reduced (about 20 Tott or less) to remove a volatile component. The product was measured by gel permeation chromatography. Mn was 2,068 and Mw was 3,684. The amount of residue cyclopentasilane that remained without polymerization was 18.9% by mass.

Comparative Example 2 (Synthesis of Polycyclopentasilane by Polymerization of Cyclopentasilane Using Palladium Catalyst Supported on Carbon)

Cyclopentasilane (1.0 g) was placed in a glass sample tube that contained 0.44% by mole of commercially available Pd/C (available from EVONIK, Pd content: 5.0% by mass, 62.1 mg) under an inert atmosphere. The sample tube was loosely capped. In the sample tube, the reaction mixture was stirred for 5 hours. The product after 5 hours was measured by gel permeation chromatography. Mn was 2,844 and Mw was 5,299. The amount of residue cyclopentasilane that remained without polymerization was 60.0% by mass.

Comparative Example 3 (Synthesis of Polycyclopentasilane by Polymerization of Cyclopentasilane Using Platinum Black Catalyst)

Cyclopentasilane (0.8 g) was placed in a glass sample tube that contained 0.44% by mole of commercially available platinum black catalyst (available from Wako Pure Chemical Industries, Ltd., 4.0 mg) under an inert atmosphere. The sample tube was loosely capped. In the sample tube, the reaction mixture was stirred for 6 hours. The reaction was then terminated with 4.51 g of cyclohexane. An insoluble component was sedimented, and the mixture was then filtered through a membrane filter made of polytetrafloroethylene with a pore diameter of 0.45 μm. Subsequently, the solution was placed in a recovery flask, and a pressure was reduced (about 20 Torr or less) to remove a volatile component. The product can be stored as a 13.5% by mass solution in which the product is dissolved in distilled cyclohexane. The product was measured by gel permeation chromatography. Mn was 1,117 and Mw was 1,396. The amount of residue cyclopentasilane that remained without polymerization was 15.6% by mass.

INDUSTRIAL APPLICABILITY

A highly conductive and good silicon thin film can be produced on a substrate by forming a coating-type polysilane composition using the polysilane having a large weight average molecular weight of the present invention, and applying the composition to the substrate, followed by baking.

The invention claimed is:

1. A method for producing a polymer of cyclopentasilane, comprising polymerizing the cyclopentasilane in the presence of a palladium catalyst comprises a zero-valent palladium complex or a divalent palladium compound microencapsulated with functional polystyrene.

2. The method according to claim 1, wherein the palladium catalyst microencapsulated with the functional polystyrene comprises the divalent palladium compound bonded to the functional polystyrene.

3. The method according to claim 1, wherein the functional polystyrene comprises a polystyrene having a polyethylene oxide group with a hydroxy group at a terminal thereof or a polystyrene having a diphenylphosphino group.

4. The method according to claim 1, wherein the method further comprises: reacting a cyclic silane of Formula (1):

$$(SiR^1R^2)_n \qquad (1)$$

wherein $R^1$ and $R^2$ are each a hydrogen atom, a $C_{1-6}$ alkyl group, or a substituted or unsubstituted phenyl group (provided that both $R^1$ and $R^2$ are not simultaneously hydrogen atoms), and n is an integer of 4 to 6, with a hydrogen halide in an organic solvent in a presence of an aluminum halide to obtain a cyclic silane of Formula (2):

$$(SiR^3R^4)_n \qquad (2)$$

wherein $R^3$ and $R^4$ are each a halogen atom, and n is an integer of 4 to 6, and reducing the cyclic silane of Formula (2) with hydrogen or lithium aluminum hydride to obtain a cyclic silane of Formula (3):

$$(SiH_2)_n \qquad (3)$$

wherein n is an integer of 4 to 6, and the cyclic silane of Formula (3) includes the cyclopentasilane.

5. The method according to claim 4, wherein both $R^1$ and $R^2$ are phenyl groups.

6. The method according to claim 4, wherein both $R^3$ and $R^4$ are chlorine atoms.

7. The method according to claim 4, wherein the cyclic silane of Formula (3) contains the cyclopentasilane in an amount of 80% or more by moles.

8. The method according to claim 1, wherein the palladium catalyst comprises the zero-valent palladium complex.

9. The method according to claim 8, wherein the zero-valent palladium complex is a tetrakis(triphenylphosphine)palladium (0) complex.

10. A method for producing a polymer of cyclopentasilane, comprising polymerizing the cyclopentasilane in the presence of a palladium catalyst supported on a polystyrene having a polyethylene oxide group with a hydroxy group at a terminal thereof or a polystyrene having a diphenylphosphino group.

11. The method according to claim 10, wherein the palladium catalyst comprises a divalent palladium compound.

12. The method according to claim 10, wherein the palladium catalyst comprises a zero-valent palladium complex.

13. The method according to claim 12, wherein the zero-valent palladium complex is a tetrakis(triphenylphosphine)palladium (0) complex.

14. A method for producing a polymer of cyclopentasilane, comprising:

reacting a cyclic silane of Formula (1):

$$(SiR^1R^2)_n \qquad (1)$$

wherein $R^1$ and $R^2$ are each a hydrogen atom, a $C_{1-6}$ alkyl group, or a substituted or unsubstituted phenyl group (provided that both $R^1$ and $R^2$ are not simultaneously hydrogen atoms), and n is an integer of 4 to 6, with a hydrogen halide in an organic solvent in a presence of an aluminum halide to obtain a cyclic silane of Formula (2):

$$(SiR^3R^4)_n \qquad (2)$$

wherein $R^3$ and $R^4$ are each a halogen atom, and n is an integer of 4 to 6;

reducing the cyclic silane of Formula (2) with hydrogen or lithium aluminum hydride to obtain a cyclic silane of Formula (3):

$$(SiH_2)_n \qquad (3)$$

wherein n is an integer of 4 to 6; and polymerizing the cyclic silane of Formula (3) in the presence of a palladium catalyst supported on a polymer, wherein the cyclic silane of Formula (3) includes the cyclopentasilane.

15. The method according to claim 14, wherein both $R^1$ and $R^2$ are phenyl groups.

16. The method according to claim 15, wherein both $R^3$ and $R^4$ are chlorine atoms.

17. The method according to claim 14, wherein the cyclic silane of Formula (3) contains the cyclopentasilane in an amount of 80% or more by moles.

18. The method according to claim 14, wherein the functional polystyrene comprises a polystyrene having a polyethylene oxide group with a hydroxy group at a terminal thereof or a polystyrene having a diphenylphosphino group.

19. The method according to claim 18, wherein the palladium catalyst comprises a divalent palladium compound.

20. The method according to claim 18, wherein the palladium catalyst comprises a zero-valent palladium compound.

\* \* \* \* \*